(12) United States Patent
Miyama et al.

(10) Patent No.: US 10,074,550 B2
(45) Date of Patent: Sep. 11, 2018

(54) PLASMA STABILITY DETERMINATION METHOD AND PLASMA PROCESSING APPARATUS

(71) Applicant: TOKYO ELECTRON LIMITED, Tokyo (JP)

(72) Inventors: Ryo Miyama, Miyagi (JP); Naoto Watanabe, Miyagi (JP); Koichiro Nakamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 36 days.

(21) Appl. No.: 15/501,235

(22) PCT Filed: Jul. 7, 2015

(86) PCT No.: PCT/JP2015/069521
§ 371 (c)(1),
(2) Date: Feb. 2, 2017

(87) PCT Pub. No.: WO2016/021355
PCT Pub. Date: Feb. 11, 2016

(65) Prior Publication Data
US 2017/0229332 A1    Aug. 10, 2017

(30) Foreign Application Priority Data

Aug. 6, 2014 (JP) .................... 2014-160542

(51) Int. Cl.
*H01L 21/00* (2006.01)
*H01L 21/67* (2006.01)
(Continued)

(52) U.S. Cl.
CPC .... *H01L 21/67253* (2013.01); *H01L 21/3065* (2013.01); *H01L 21/67069* (2013.01);
(Continued)

(58) Field of Classification Search
CPC .................. H01J 2237/30466; H01J 37/32798
See application file for complete search history.

(56) References Cited

U.S. PATENT DOCUMENTS

2012/0288969 A1* 11/2012 Nakao ............... H01J 37/32963
438/9

FOREIGN PATENT DOCUMENTS

JP         2006-324316 A      11/2006

OTHER PUBLICATIONS

International Search Report dated Sep. 15, 2015 in PCT/JP2015/069521.

* cited by examiner

*Primary Examiner* — Julio J Maldonado
*Assistant Examiner* — Andre' C Stevenson
(74) *Attorney, Agent, or Firm* — Rothwell, Figg, Ernst & Manbeck, P.C.

(57) ABSTRACT

A method and apparatus for determining a stability of plasma in a plasma processing apparatus for performing a plasma processing by converting into plasma a processing gas supplied into a processing container. The method includes: detecting a light emission intensity of the plasma in the processing container while the plasma is generated in the processing container; generating a first function representing a relationship between time and the light emission intensity from a detection result of the light emission intensity; differentiating the first function with time to calculate a differential value, and generating a second function from a relationship between an absolute value of the differential value and time; and integrating the second function with time to calculate an integral value, and determining a stability of the plasma based on the calculated integral value. A related apparatus is also provided.

12 Claims, 5 Drawing Sheets

(51) Int. Cl.
*H01L 21/66* (2006.01)
*H01L 21/3065* (2006.01)
*H05H 1/00* (2006.01)
*H05H 1/46* (2006.01)

(52) U.S. Cl.
CPC ........... *H01L 22/10* (2013.01); *H05H 1/0025* (2013.01); *H05H 1/46* (2013.01); *H05H 2001/463* (2013.01)

PLASMA STABILITY DETERMINATION METHOD AND PLASMA PROCESSING APPARATUS

CROSS-REFERENCE TO RELATED APPLICATIONS

This application is a 35 U.S.C. 371 National Phase Entry Application from PCT/JP2015/069521, filed Jul. 7, 2015, which claims priority from Japanese Patent Application No. 2014-160542 filed on Aug. 6, 2014 with the Japan Patent Office, the disclosure of which are incorporated herein in their entirety by reference.

TECHNICAL FIELD

The present disclosure relates to a method for determining a stability of plasma in a plasma processing apparatus for performing a processing on a workpiece by converting a processing gas supplied into a processing container into plasma, and a plasma processing apparatus.

BACKGROUND

In manufacturing a semiconductor device, a film forming processing or an etching processing is performed using a plasma processing apparatus on a semiconductor wafer (hereinafter, simply referred to as a "wafer") as a workpiece. In the film forming processing or the etching processing, a gas is introduced into a vacuum processing chamber in which the wafer is accommodated, and a plasma processing is performed on the wafer by plasma of the gas.

In the processing container in which the plasma processing is performed, various factors may raise abnormal discharge (e.g., arc discharge), or reaction products attached to components in the processing container may be peeled off so that particles may be generated. Any of these may cause wafer defects.

Further, the plasma processing is used in a step at a relatively upstream side of the semiconductor device manufacture. Thus, when there is an abnormality in the plasma processing, the wafer processing may be continuously performed until the abnormality is found in a defect inspection step downstream of the above-mentioned step. As a result, a large number of defective wafers are produced during that period so that the yield of products is reduced. Therefore, it is required to stably perform the plasma processing and detect an abnormality in the plasma processing at an early stage.

Therefore, for example, Patent Document 1 has suggested a method for diagnosing a state of a plasma processing apparatus by monitoring a predetermined parameter while a plasma processing is performed in the plasma processing apparatus. According to the method of Patent Document 1, the plasma processing is performed on a dummy wafer for inspection by using a recipe for state diagnosis to acquire a predetermined parameter. Then, the presence/absence of abnormality of the plasma processing apparatus is diagnosed by comparing the acquired parameter with a parameter previously acquired in a state where there is no abnormality in the apparatus.

PRIOR ART DOCUMENT

Patent Document

Patent Document: Japanese Patent Laid-Open Publication No. 2006-324316

DISCLOSURE OF THE INVENTION

Problems to be Solved

However, when an abnormal discharge occurs due to a certain factor in the plasma processing, in other words, when the plasma in the processing container becomes unstable, the above-mentioned parameter may frequently or largely fluctuate. In such a case, the stability of the plasma processing may not be ensured. Thus, the uniformity of the plasma processing in the plane of the wafer is deteriorated. As a result, some defects may occur on the wafer.

In a case where the parameter fluctuates, when the fluctuation exceeds, for example, the reference value described in Patent Document 1, an abnormality may be detected by the method of Patent Document 1. However, the present inventors have found that, in the method of Patent Document 1, a defect is generated in the wafer, even though the fluctuation range of the parameter falls within the reference value. In the case where the parameters fluctuate, it is presumed that the cause of the defect is that plasma cannot be stably generated in the processing container, thereby deteriorating the uniformity of the plasma processing in the plane of the wafer.

In addition, for example, in a case where the abnormality cannot be detected by the method of Patent Document 1, the plasma processing may be continued in a state where the plasma is not stable, so that a large number of defective wafers are produced until the abnormality is found in the subsequent defect inspection step. Therefore, a method for determining the stability of the plasma in the plasma processing apparatus is newly required.

The present disclosure has been made in consideration of the problems, and an object of the present disclosure is to properly determine the stability of the plasma in the plasma processing apparatus.

Means to Solve the Problems

In order to achieve the above-described object, the present disclosure provides a method for determining a stability of plasma in a plasma processing apparatus for performing a plasma processing by converting into plasma a processing gas supplied into a processing container. The method includes: detecting a light emission intensity of the plasma in the processing container while the plasma is generated in the processing container; generating a first function representing a relationship between time and the light emission intensity from a detection result of the light emission intensity; differentiating the first function with time to calculate a differential value, and generating a second function from a relationship between an absolute vale of the differential value and time; and integrating the second function with time to calculate an integral value, and determining a stability of the plasma based on the calculated integral value.

According to the present disclosure, the first function generated based on the detection result of the light emission intensity is differentiated with time, and the second function is generated based on the absolute value of the differential value. The second function indicates a degree of fluctuation of the light emission intensity, and the integral value of the second function indicates a total amount of fluctuation of the light emission intensity. Therefore, when the integral value of the second function exceeds, for example, a predetermined threshold value set in advance, it may be determined that there is no stability of the plasma, and when the integral value of the second function is less than the threshold value, it may be determined that there is a stability.

In other aspect, the present disclosure provides a plasma processing apparatus for performing a plasma processing by converting into plasma a processing gas supplied into a processing container. The apparatus includes: a processing gas supply unit that supplies a processing gas into the processing container; a plasma generator that generates plasma of the processing gas in the processing container; a light emission detecting mechanism that detects a light emission intensity of the plasma generated in the processing container; a first function generating unit that generates a first function representing a relationship between time and the light emission intensity from a detection result of the light emission intensity by the light emission detecting mechanism; a second function generating unit that differentiates the first function with time to calculate a differential value, and generates a second function from a relationship between an absolute vale of the differential value and time; and a stability determining unit that integrates the second function with time to calculate an integral value, and determines a stability of the plasma based on the calculated integral value.

Effect of the Invention

According to the present disclosure, it is possible to properly determine the stability of the plasma in the plasma processing apparatus.

DETAILED DESCRIPTION TO EXECUTE THE INVENTION

Figure 1:
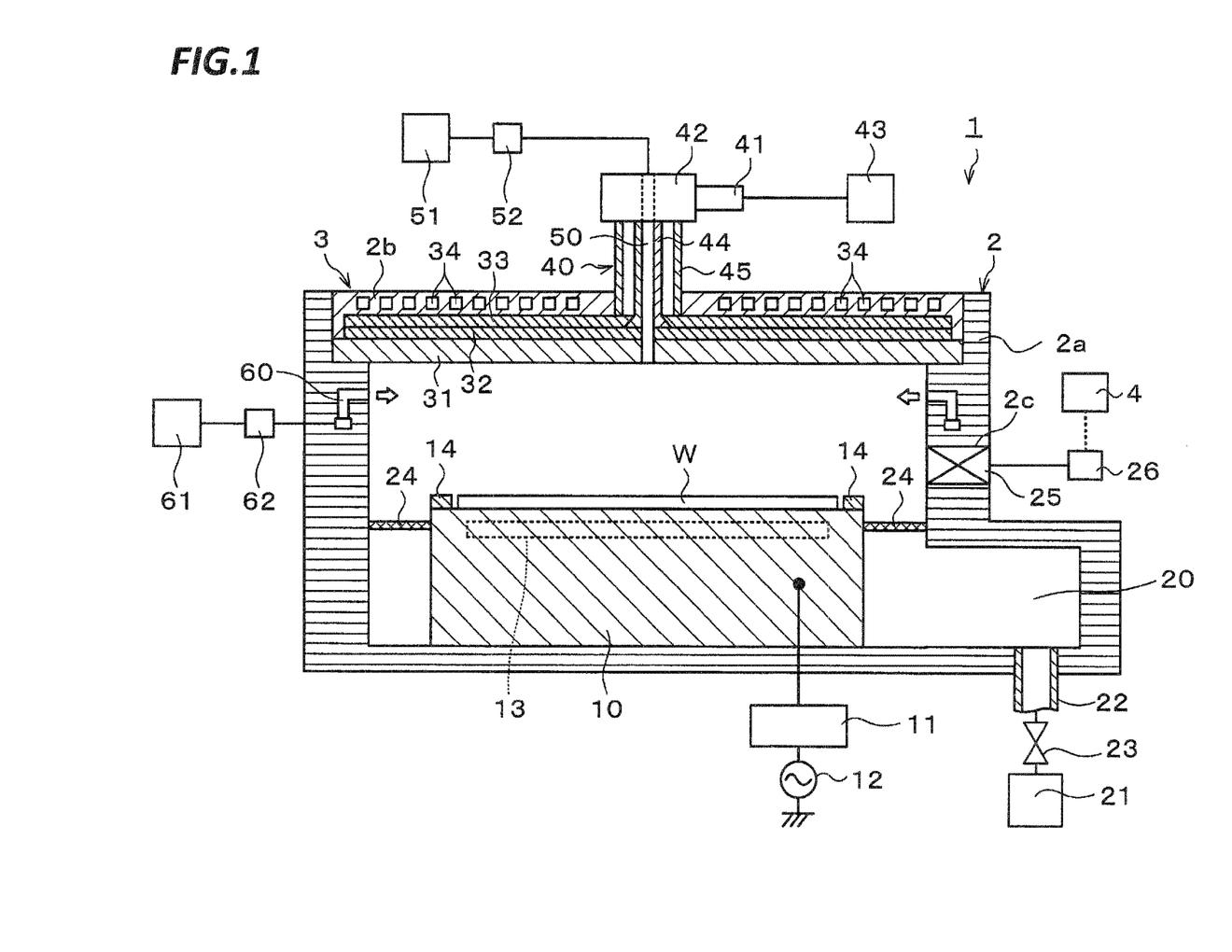
FIG. 1 is a vertical-sectional view illustrating a schematic configuration of a plasma processing apparatus according to an exemplary embodiment of the present disclosure.

Hereinafter, an exemplary embodiment of the present disclosure will be described. FIG. 1 is a vertical-sectional view illustrating a schematic configuration of a plasma processing apparatus 1 according to an exemplary embodiment of the present disclosure. In the exemplary embodiment, descriptions will be made on a case where the stability of plasma in the plasma processing apparatus 1 is determined when a resist film formed on the surface of a wafer W is etched by a plasma processing using, for example, an oxygen-containing gas and a fluorine-containing gas. In the present specification and drawings, components having substantially the same functional configurations will be denoted by the same symbols, and the overlapping descriptions thereof will be omitted.

The plasma processing apparatus 1 includes a processing container 2 of which the inside is hermetically maintained, a radial line slot antenna 3 that supplies microwaves for plasma generation into the processing container 2, and a controller 4 that performs, for example, a plasma stability determining method. The processing container 2 includes a substantially cylindrical main body 2a with the top opened, and a substantially disc-shaped cover 2b that hermetically closes the opening of the main body 2a. The main body 2a and the cover 2b are made of a metal such as, for example, aluminum. Further, the main body 2a is grounded by a ground wire (not illustrated).

A susceptor 10 is provided on the bottom surface of the main body 2a of the processing container 2 to place a wafer W thereon. The susceptor 10 is, for example, disc-shaped, and is made of a metal such as, for example, aluminum. The susceptor 10 is connected with a high frequency power source 12 for RF bias via a matcher 11. The high frequency power source 12 outputs a high frequency wave of a constant frequency suitable for controlling the energy of the ions drawn into the wafer W (e.g., 13.65 MHz). Although not illustrated, an electrostatic chuck is provided in the susceptor 10 to statically attract the wafer W. Thus, the wafer W may be electrostatically attracted onto the susceptor 10. Further, a heater 13 is provided inside the susceptor 10 to heat the wafer at a predetermined temperature.

A lift pin (not illustrated) is provided below the susceptor 10 to support and lift the wafer W from the bottom. The lift pin is inserted through a through-hole (not illustrated) formed in the susceptor 10 so as to protrude from the top surface of the susceptor 10.

An annular focus ring 14 is provided on the top surface of the susceptor 10 to surround the wafer W. For example, an insulating material (e.g., ceramic or quartz) is used for the focus ring 14. Plasma generated in the processing container 2 is converged on the wafer W by the action of the focus ring 14, thereby improving the uniformity of the plasma processing in the plane of the wafer W.

An exhaust chamber 20 is formed in the bottom of the main body 2a of the processing container 2 to protrude, for example, to the side of the main body 2a. An exhaust mechanism 21 is connected to the bottom surface of the exhaust chamber 20 via an exhaust pipe 22 to exhaust the atmosphere inside the processing container 2. An adjustment valve 23 is provided in the exhaust pipe 22 to adjust an amount exhausted by the exhaust mechanism 21.

An annular baffle plate 24 is provided above the exhaust chamber 20 along the outer surface of the susceptor 10 and the inner surface of the main body 2a to uniformly exhaust the atmosphere inside the processing container 2. The baffle plate 24 includes openings (not illustrated) formed over the entire circumference thereof so as to penetrate the baffle plate 24 in the thickness direction.

An opening 2c is formed in the side of the main body 2a of the processing container 2 and above the baffle plate 24. An observation window 25 is provided in the opening 2c to observe the inside of the processing container 2, and a light emission detecting mechanism 26 is provided in the observation window 25 to detect a light emission intensity of the plasma in the processing container 2. The light emission detecting mechanism 26 may be, for example, an optical emission spectrometer (OES). The detection result of the light emission intensity in the light emission detecting mechanism 26 is input to the controller 4. Further, a carry-in/out port (not illustrated) and a gate valve (not illustrated) are formed in the side of the main body 2a of the processing container 2 to perform carry-in/out of a wafer W from/to the outside, and the gate valve hermetically closes the carry-in/out port.

A radial line slot antenna 3 is provided in the ceiling side opening of the processing container 2 to supply microwaves for plasma generation into the processing container 2. The radial line slot antenna 3 includes a microwave transmitting plate 31, a slot plate 32, and a slow-wave plate 33. The microwave transmitting plate 31, the slot plate 32, and the slow-wave plate 33 are stacked in this order from the bottom, and provided in the opening of the main body 2a of the processing container 2. The top surface of the slow-wave plate 33 is covered by the cover 2b.

The gap between the microwave transmitting plate 31 and the main body 2a is hermetically maintained by a sealing material such as, for example, an O-ring (not illustrated). The microwave transmitting plate 31 is formed of a dielectric such as, for example, quartz, $Al_2O_3$, or AlN. The microwave transmitting plate 31 transmits the microwaves.

The slot plate 32 is provided on the top surface of the microwave transmitting plate 31, and is formed with a plurality of slots. The slot plate 32 functions as an antenna. The slot plate 32 is formed of a conductive material such as, for example, copper, aluminum, or nickel.

The slow-wave plate 33 is provided on the top surface of the slot plate 32, and is formed of a low-loss dielectric material such as, for example, quartz, $Al_2O_3$, or AlN. The slow-wave plate 33 shortens the wavelength of the microwaves.

The cover 2b covers the top surface of the slow-wave plate 33. A plurality of annular flow paths 34 are formed inside the cover 2b to make, for example, a cooling medium circulate therethrough. The cover 2b, the microwave transmitting plate 31, the slot plate 32, and the slow-wave plate 33 are adjusted to a predetermined temperature by the cooling medium flowing through the flow paths 34.

A coaxial waveguide 40 is connected to a central portion of the cover 2b. A microwave generator 43 is connected to the upper portion of the coaxial waveguide 40 via a rectangular waveguide 41 and a mode converter 42. The microwave generator 43 is provided outside the processing container 2, and is capable of generating microwaves of, for example, 2.45 GHz.

The coaxial waveguide 40 includes an inner conductor 44 and an outer pipe 45. The inner conductor 44 is connected to the slot plate 32. The slot plate 32 side of the inner conductor 44 is formed in a conical shape, and configured to efficiently propagate the microwaves to the slot plate 32.

With the configuration, the microwaves generated from the microwave generator 43 are propagated sequentially through the rectangular waveguide 41, the mode converter 42, and the coaxial waveguide 40, and compressed by the slow-wave plate 33 such that the wavelength of the microwaves is shortened. Then, circularly polarized waves are generated from the slot plate 32, transmitted through the microwave transmitting plate 31, and irradiated into the processing container 2. A processing gas is converted into plasma in the processing container 2 by the microwaves, and the plasma processing of the wafer W may be performed by the plasma.

In the exemplary embodiment, the radial line slot antenna 3, the coaxial waveguide 40, the rectangular waveguide 41, the mode converter 42, and the microwave generator 43 constitute the plasma generating unit in the present disclosure.

A first processing gas supply pipe 50 is provided in the central portion of the ceiling surface of the processing container 2, that is, the central portion of the radial line slot antenna 3. The first processing gas supply pipe 50 penetrates the radial line slot antenna 3 vertically such that one end portion of the first processing gas supply pipe 50 is opened in the bottom surface of the microwave transmitting plate 31. Further, the first processing gas supply pipe 50 penetrates the inside of the inner conductor 44 of the coaxial waveguide 40, and is further inserted through the mode converter 42. The other end of the first processing gas supply pipe 50 is connected with a first processing gas source 51.

The first processing gas source 51 is configured to individually supply, for example, $O_2$ gas and $CF_4$ gas as process gases. In the following descriptions, the processing gases may be collectively referred to as a "first processing gas." The first processing gas supply pipe 50 is provided with a supply equipment group 52 including, for example, a valve or a flow rate adjusting unit that controls the flow of the first processing gas. The first processing gas supplied from the first processing gas source 51 is supplied into the processing container 2 through the first processing gas supply pipe 50, and flows vertically downwardly toward the wafer W placed on the susceptor 10.

As illustrated in FIG. 1, second gas supply pipes 60, which serve as the second gas supply unit, are provided on the inner peripheral side of the top portion of the processing container 2. A plurality of second gas supply pipes 60 are provided at equal intervals along the inner peripheral side of the processing container 2. Each of the second processing gas supply pipes 60 is connected with a first processing gas source 61. The inside of the second processing gas source 61 is configured to individually supply, for example, $O_2$ gas and $CF_4$ gas as process gases. In the following descriptions, the processing gases may be collectively referred to as a "second processing gas." The second processing gas supply pipe 60 is provided with a supply equipment group 62 including, for example, a valve or a flow rate adjusting unit that controls the flow of the second processing gas. The second processing gas supplied from the second processing gas source 61 is supplied into the processing container 2 through the second processing gas supply pipe 60, and flows vertically downwardly toward the outer peripheral portion of the wafer W placed on the susceptor 10. Therefore, the first processing gas from the first processing gas supply pipe 50 is supplied toward the central portion of the wafer W, and the second processing gas from the second processing gas supply pipe 60 is supplied toward the outer peripheral portion of the wafer W.

The processing gases supplied into the processing container 2 from the first processing gas supply pipe 50 and the second processing gas supply pipe 60, respectively, may be the same as or different from each other. Those processing gases may be supplied at independent flow rates or at any flow rate ratio.

Next, prior to explaining the controller 4, descriptions will be first made on the principle of the plasma stability determining method according to the present disclosure.

Figure 2:
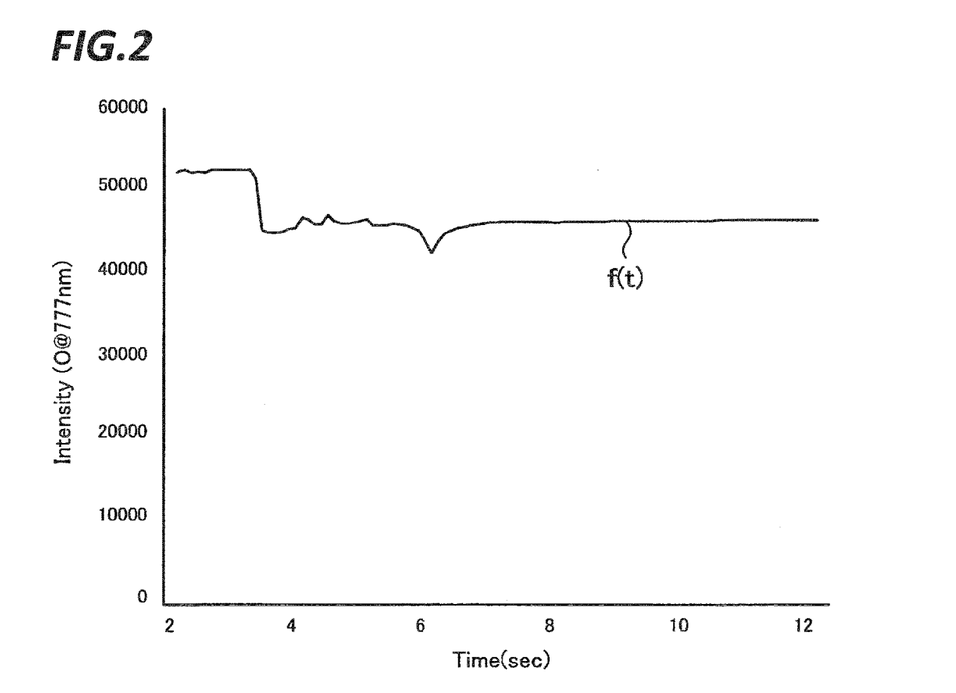
FIG. 2 is an explanatory view illustrating a first function representing a relationship between a light emission intensity and time.
Figure 3:
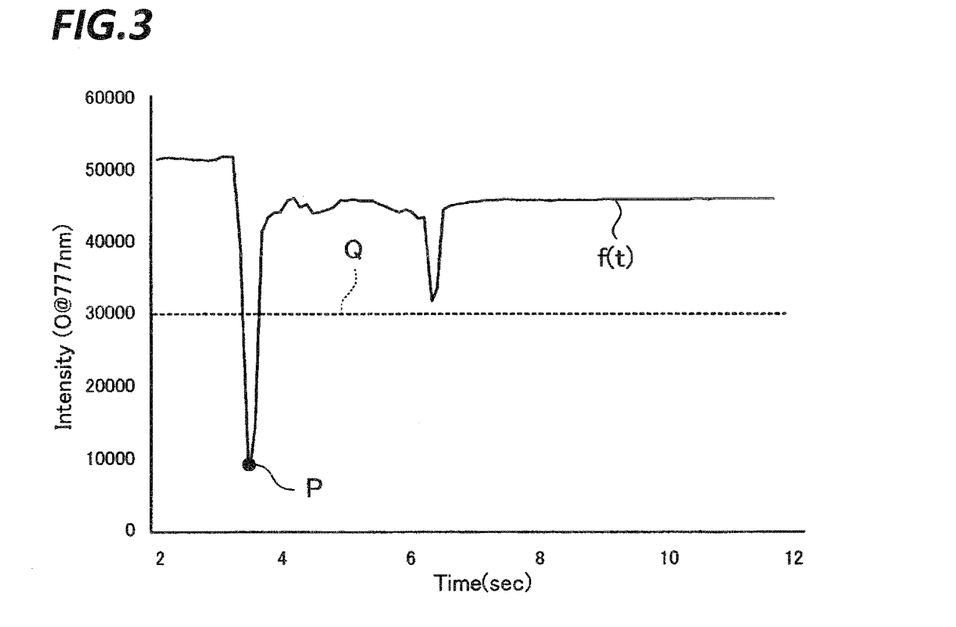
FIG. 3 is an explanatory view illustrating a first function representing a relationship between a light emission intensity and time.
Figure 4:
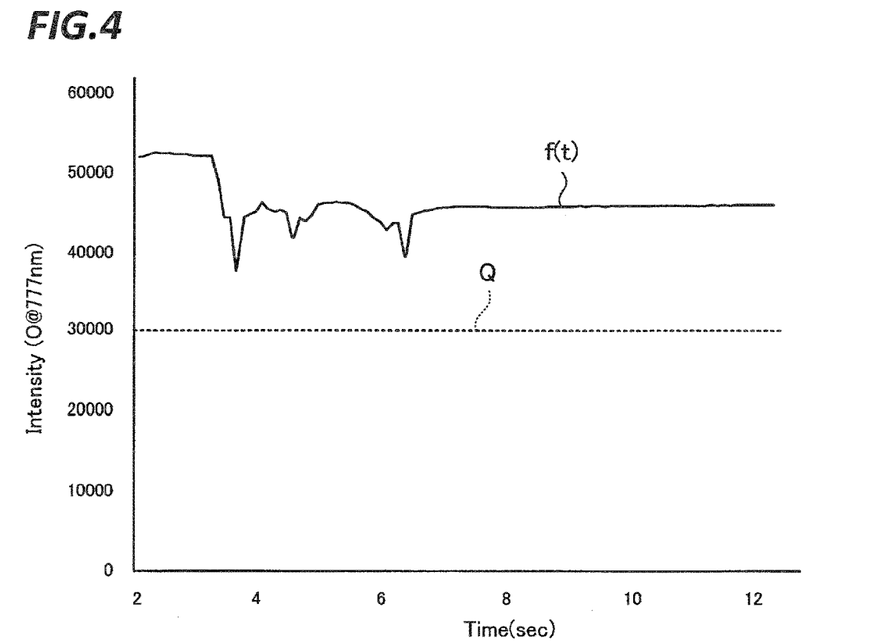
FIG. 4 is an explanatory view illustrating a first function representing a relationship between a light emission intensity and time.

During the plasma processing in the plasma processing apparatus 1, when the light emission intensity of the plasma in the processing container 2 is detected using, for example, a light emission detecting mechanism 26, graphs representing a relationship between time and a light emission intensity, for example, as illustrated in FIGS. 2 to 4, may be obtained. In FIGS. 2 to 4, the horizontal axis represents time, and the vertical axis represents a light emission intensity. FIG. 2 illustrates an example in which the fluctuation of the light emission intensity is not large in both amplitude and frequency (period). Here, in the plasma processing with a light emission intensity distribution as illustrated in FIG. 2, it is confirmed that the wafer W is appropriately processed, and there is no abnormality in the wafer W in the subsequent defect inspection step. In other words, in a case of having a light emission distribution as illustrated in FIG. 2, the plasma in the processing container 2 is stable, and as a result, a stable plasma processing is performed.

FIG. 3 illustrates an example in which the fluctuation period of the light emission intensity is substantially the same as that in FIG. 2, but the fluctuation range of the amplitude is very large. Further, FIG. 4 illustrates an example in which the fluctuation period of the light emission intensity is substantially the same as or slightly greater than those of FIGS. 2 and 3, but the fluctuation range of the amplitude is smaller than that of FIG. 3 and larger than that of FIG. 2.

In the plasma processing performed by the plasma having a light emission intensity distribution as illustrated in FIG. 3 or 4, it is confirmed that an abnormality due to the plasma processing is found on the wafer W in the subsequent defect inspection step. That is, in a case of having a light emission distribution as illustrated in FIG. 3, it cannot be said that the stability of the plasma is sufficient.

In determining the suitability of the plasma processing, for example, using the method disclosed in Patent Document 1, that is, when the light emission intensity of the light derived from the plasma detected by the light emission detecting mechanism 26 is compared with a predetermined reference value, an abnormality may be detected, for example, in the case where the light emission intensity as illustrated in FIG. 3 is obtained, but, no abnormality may be detected in the case where the light emission intensity as illustrated in FIG. 4 is obtained. Specifically, for example, as illustrated in FIG. 3, when a reference value (the broken line Q in FIG. 3) is set to "30,000" and the minimum value of the light emission intensity of the plasma (point P in FIG. 3) is clearly below the reference value, the abnormality of the plasma may be easily detected.

On the other hand, even though the light emission intensity fluctuates frequently, in the case where the light emission intensity is not lower than the reference value as illustrated in FIG. 4, no abnormality may be detected even by using the method disclosed in Patent Document 1. Then, in the case illustrated in FIG. 4, no abnormality may be detected immediately, and thus, a large number of defective wafers are produced until the abnormality is found in the subsequent defect inspection process.

In order to avoid such a situation, it is considered that, for example, an operator confirms a waveform of the light emission intensity detected by the light emission detecting mechanism 26 for each processing of the wafer W or every predetermined number of processings. Alternatively, it is considered that the reference value is set high to determine the abnormality. However, the confirmation by the operator causes a heavy burden on the operator. Even though the operation of confirming the light emission intensity is performed by the operator, in the case of having the intensity distribution as illustrated in FIG. 4, that is, when the minimum value of the light emission intensity is not lower than the reference value, it is difficult to determine whether there is an abnormality, and the determination result may be greatly different depending on the skill of the operator. In addition, when the reference value is set high, it is undesirable because it is more likely that an abnormality is determined even though it is not originally abnormal.

Therefore, the present inventors have intensively studied on a method of determining a stability of plasma in the plasma processing apparatus 1, and has considered that the stability of plasma may be determined based on quantified information obtained by quantifying, for example, the degree of change in light emission intensity, in other words, quantifying the stability of the light emission intensity. Then, the present inventors have further studied on the method of quantifying the stability of the light emission intensity, and have conceived that the frequency or magnitude of fluctuation of the light emission intensity may be quantified by differentiating the relationship between the light emission intensity and time with time, for example, as illustrated in FIGS. 2 to 4 and obtaining the absolute value of the differential value.

Figure 5:
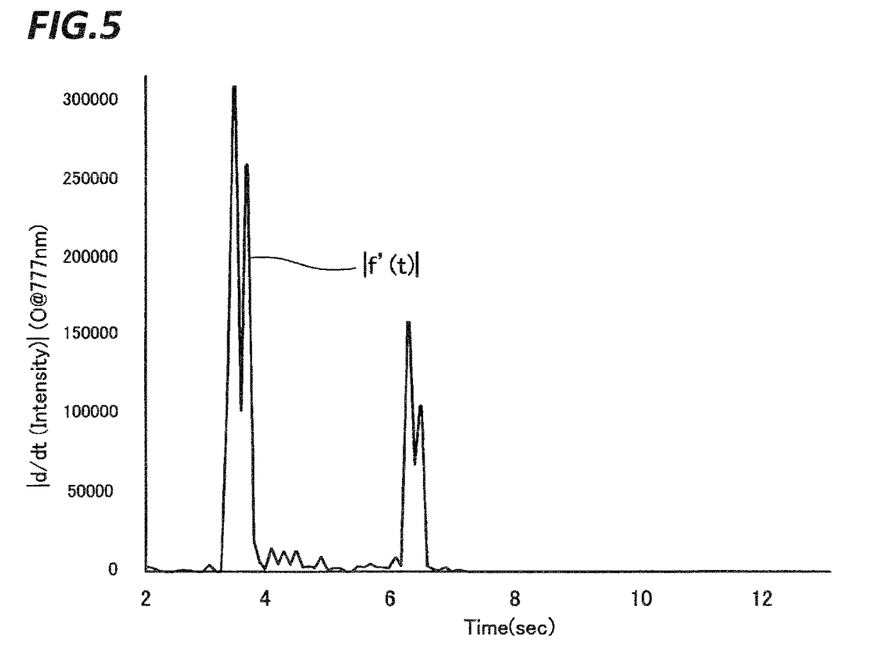
FIG. 5 is an explanatory view illustrating a second function representing a relationship between an absolute vale of a differential value of the first function and time.

Specifically, the relationship between the light emission intensity and time, for example, as illustrated in FIG. 3 is differentiated with time, and the absolute vale of the differential value is obtained. Then, a graph of a waveform, for example, as illustrated in FIG. 5 is obtained. In FIG. 5, the horizontal axis represents time, and the vertical axis represents a time differential value.

Figure 6:
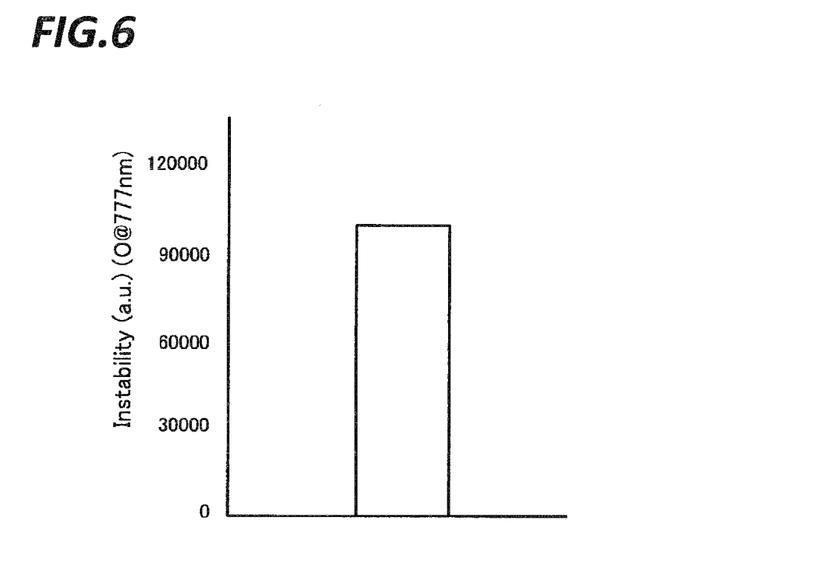
FIG. 6 is an explanatory view illustrating an integral value obtained by definitely integrating the second function.

Then, when the graph illustrated in FIG. 5 is definitely integrated over a predetermined period, the area surrounded by the graph illustrated in FIG. 5 and the horizontal axis may be obtained as a numerical value (integral value) as illustrated in FIG. 6. Then, for example, a test is carried out in advance to detect the light emission intensities detected in the case where plasma processing is performed without any abnormality and in the case where some abnormality is occurred, respectively, and an integral value as illustrated in FIG. 6 is obtained based on the detected light emission intensity. Then, a predetermined threshold value is set based on the obtained integral value and the emission intensity of the plasma during the plasma processing is evaluated based on the threshold value. Thus, it is possible to detect the abnormality due to the stability of the plasma, which cannot be detected by the method of Patent Document 1.

The basic principle of the present disclosure is as described above. Next, descriptions will be made on the controller 4 for determining the stability of the plasma based on this principle.

Figure 8:
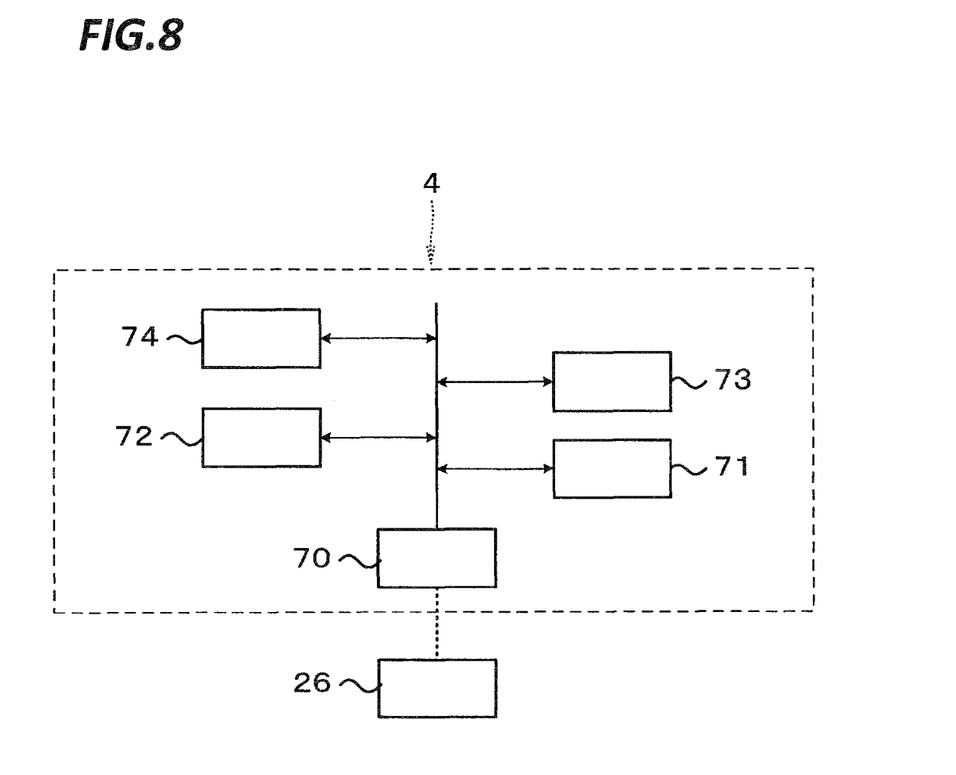
FIG. 8 is an explanatory view illustrating a schematic configuration of a controller.

For example, as illustrated in FIG. 8, the controller 4 includes an input unit 70 that inputs a detection result of the light emission intensity by the light emission detecting mechanism 26; a first function generating unit 71 that generates a first function representing a relationship between time and the light emission intensity from the detection result of the light emission intensity; a second function generating unit 72 that differentiates the first function with time to calculate a differential value, and generates a second function from a relationship between an absolute vale of the differential value and time; a stability determining unit 73 that calculates an integral value of the second function, and determines a stability of the plasma based on the calculated integral value; and an output unit 74 that outputs a determination result of the stability determining unit 73.

The light emission intensity of the plasma in the processing container 2, which is detected by the light emission detecting mechanism 26 during the plasma processing, is input as an electric signal to the first function generation unit 71 via the input unit 70. The first function generating unit 71 generates a first function f(t) representing a relationship between the light emission intensity and time, for example, as illustrated in FIGS. 2 to 4 (hereinafter, simply referred to as a "first function"). In the exemplary embodiment, the light emission intensity as illustrated in FIGS. 2 to 4 is derived from oxygen plasma having a wavelength of, for example, 777 nm.

In the second function generating unit 72, the first function f(t) generated in the first function generating unit 71 is differentiated with time to obtain f'(t). Subsequently, a second function |f'(t)| (hereinafter, simply referred to as a "second function") as illustrated in FIG. 5 is generated from a relationship between the absolute value of f'(t) and time. As described above, the second function illustrated in FIG. 5 is obtained from the first function illustrated in FIG. 3.

The stability determining unit 73 first calculates an integral value of the second function. Specifically, the second function is definitely integrated over a predetermined period to obtain a fluctuation amount of the light emission intensity as a numerical value, for example, as illustrated in FIG. 6. Then, the stability determining unit 73 compares the integral value of the second function with a predetermined threshold value. For example, when the integral value exceeds the threshold value, it cannot be said that the plasma with the detected light emission intensity distribution has a sufficient stability. Thus, it is determined that there are some abnormalities. A plurality of inspection results of the wafer W subjected to the plasma processing in the plasma processing apparatus 1 and the data of the light emission intensity corresponding to the inspection result may be accumulated, and the threshold value for determining the stability of the plasma may be determined, for example, based on the accumulated data. Alternatively, the threshold value may be appropriately determined based on a result of a test performed in advance, or by various methods.

The output unit 74 displays the determination result of the stability of the plasma from the stability determining unit 73, or various data, for example, illustrated in FIGS. 2 to 6.

The controller 4 is constituted by a computer having, for example, a CPU and a memory, and may implement the plasma processing in the plasma processing apparatus 1 by executing, for example, a program stored in the memory. Various programs for implementing the plasma processing in the plasma processing apparatus 1 may be stored in a storage medium such as, for example, a computer-readable hard disk (HD), a flexible disk (FD), a compact disk (CD), or a magneto-optical disk (MO), and installed to the control unit 4 from the storage medium.

The plasma processing apparatus 1 according to the present exemplary embodiment is constituted as described above. Next, descriptions will be made on the plasma processing of the wafer W to be performed by the plasma processing apparatus 1 according to the present exemplary embodiment. In the exemplary embodiment, descriptions will be made on the case where the resist film formed on the surface of the wafer W is etched by the plasma of the processing gas, as described above, by way of example.

In the processing of the wafer W, a gate valve (not illustrated) provided in the processing container is first opened so that the wafer W is carried into the processing container 2. The wafer W is placed on the susceptor 10 via the lift pin. At the same time, a DC voltage is applied to the electrostatic chuck so that the wafer W is electrostatically attracted onto the susceptor 10 by the Coulomb force. The gate valve is then closed to seal the inside of the processing container 2. Then, the exhaust mechanism 21 is operated to reduce the pressure in the processing container 2 to a predetermined pressure, for example, 400 mTorr (=53 Pa).

Thereafter, the first processing gas is supplied from the first processing gas supply pipe 50 into the processing container 2, and the second processing gas is supplied from the second processing gas supply pipe 60 into the processing container 2. At this time, the flow rate of the Ar gas supplied from the first processing gas supply pipe 50 is, for example, 100 sccm (mL/min), and the flow rate of the Ar gas supplied from the second processing gas supply pipe 60 is, for example, 750 sccm (mL/min).

The first processing gas and the second processing gas are supplied into the process container 2, and the microwave generator 43 is operated. Thus, the microwave generator 43 generates microwaves of a predetermined power at a frequency of, for example, 2.45 GHz. The microwaves are irradiated into the processing container 2 through the rectangular waveguide 41, the mode converter 42, the coaxial waveguide 40, and the radial line slot antenna 3. With the microwave, the processing gas is converted into plasma in the processing chamber 2, and dissociation of the processing gas progresses in the plasma, so that the resist film on the wafer W is etched by radicals (active species) generated at that time.

Along with the start of the plasma processing in the processing container 2, the light emission detecting mechanism 26 detects the light emission intensity of light derived from the plasma in the processing container 2. The light emission intensity detected by the light emission detecting mechanism 26 is input as an electric signal to the first function generating unit 71 via the input unit 70. The first function generating unit 71 generates a first function f(t) based on the input.

When the first function is generated in the first function generating unit 71, the second function generating unit 72 generates a second function based on the first function. Subsequently, the stability determining unit 73 definitely integrates the generated second function over a predetermined period to calculate an integral value. A target period for determination of the stability of the plasma is determined by defining the predetermined period for performing definite integration. Therefore, when determining the stability of the plasma in the plasma processing as in the present exemplary embodiment, the period from the start of the etching by the plasma processing to the end of the etching is set as the predetermined period for performing the definite integration. The period for performing the definite integration may include at least a period in which the plasma processing is performed. For example, the definite integration may be performed over a period from the ignition of the plasma to the extinguishing of the plasma, or over the entire period in which the plasma is generated in the processing chamber. The period for the definite integral to be performed may be appropriately set based on, for example, a test which is performed in advance. In addition, for example, since an end point detection (EPD) of etching by a plasma processing is usually performed based on a change in light emission of reaction products, the plasma processing apparatus 1 includes a unit for detecting the light emission in the processing container 2. Thus, the unit for detecting the light emission may be used as the light emission detecting mechanism 26.

Figure 7:
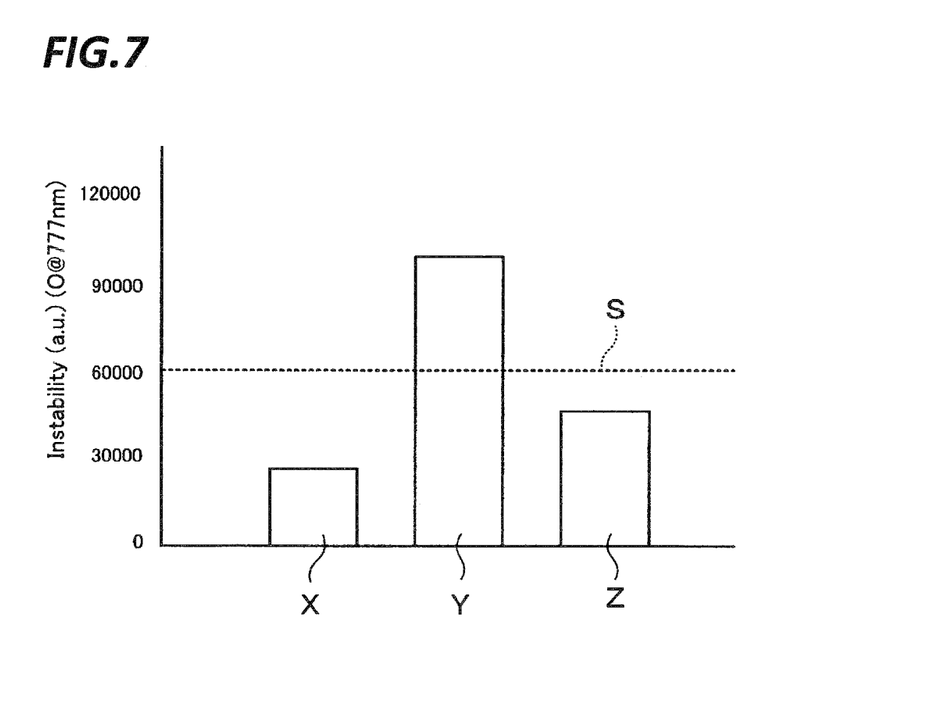
FIG. 7 is an explanatory view illustrating integral values of the second function for a plurality of wafers.

When the integral value is calculated, the stability determining unit 73 sequentially compares the integral value with the threshold value. For example, when etching is sequentially performed on three (3) wafers W by the plasma processing and integral values X, Y, and Z are obtained as illustrated in FIG. 7, respectively, the stability determining unit 73 sequentially compares the integral values X, Y, and Z with a threshold value S. Then, it is determined that the stability of the plasma is not sufficient at the integral value Y which exceeds the threshold value S, and the stability of the plasma is secured at the integral values X and Z which are not greater than the threshold value S. For example, FIG. 7 illustrates a case where the threshold value S is set to "60,000." However, the threshold value S is not limited to the content of the present exemplary embodiment, and may be arbitrarily set.

The determination result from the stability determining unit 73 is output to the output unit 74. For example, when the numerical value calculated by the definite integration exceeds the threshold value, the determination result is output together with an alarm that there is an abnormality in the plasma processing apparatus 1.

While the plasma processing is performed on the wafer W, the high frequency power source 12 applies high frequency waves of a predetermined power at a frequency of, for example, 13.56 MHz to the susceptor 10. Since ions in the plasma are drawn into the wafer W by applying RF bias in an appropriate range, the etching rate may be improved. Further, since the electron temperature of the plasma is able to be kept low by using the microwave plasma, there is no damage to the wafer W. Furthermore, since the molecules of the processing gas are easily dissociated by the high density plasma, the reaction is promoted.

When the etching processing proceeds and the resist film is removed from the wafer W, the supply of the processing gas and the irradiation of the microwaves are stopped. Thereafter, the wafer W is carried out from the processing container 2, and a series of the plasma processings is completed. Then, the plasma processing is sequentially repeated, and the stability determining unit 73 determines the stability of the plasma in the plasma processing apparatus 1 each time.

Then, for example, when integral values continuously exceed the threshold value or an integrated value largely exceeds the threshold value, it is determined that some abnormality has occurred in the plasma processing apparatus 1. Thus, cleaning or maintenance is appropriately performed on the plasma processing apparatus 1.

According to the above exemplary embodiment, the first function generating unit 71 generates a first function based on the information of the light emission intensity detected by the light emission detecting mechanism 26, and the second function generating unit 72 also generates a second function. Subsequently, the stability determining unit 73 definitely integrates the second function to obtain an integral value, thereby grasping the fluctuation amount of the light emission intensity in the processing container 2. Then, the fluctuation amount, that is, the integral value is compared with a predetermined threshold value. Therefore, it is possible to appropriately determine the stability of the plasma, which is difficult to determine in a case where the detected light emission intensity is compared with a predetermined reference value as in the conventional method, for example, the method of Patent Document 1.

Further, the absolute value of the light emission intensity of the plasma detected during the plasma processing fluctuates due to various factors such as, for example, the type of the processing gas used, the pressure in the processing container 2, and the electron temperature of the plasma. Therefore, in order to compare the light emission intensity itself with a predetermined reference value as in the conventional method, it is necessary to provide a plurality of reference values corresponding to the recipe of plasma processing. In such a case, it is necessary to perform a test using, for example, a dummy wafer in accordance with the number of recipes in order to provide a set value for each recipe, thus requiring a great deal of time and labor. On the other hand, as in the present exemplary embodiment, when the determination is made based on the frequency of fluctuation of the light emission intensity or the fluctuation amount per unit time, that is, information corresponding to the second function in the present embodiment rather than the absolute value of the light emission intensity itself, the stability of the plasma may be appropriately regardless of the contents of the recipe. The present inventors have confirmed that the information corresponding to the second function in the present exemplary embodiment (e.g., the cycle of fluctuation of the light emission intensity of the plasma in the plasma processing and the fluctuation amount per unit time) has substantially the same trend regardless the contents of the recipe.

Further, since the stability of the plasma may be determined during the plasma processing of the wafer W as a product rather than a dummy wafer as in Patent Document 1, the throughput of wafer processing is not reduced. Particularly, the instability of the plasma, in other words, the fluctuation of the light emission intensity of the plasma may be caused by various factors such as, for example, the reaction products in the processing container 2 which are peeled off and scattered, damages to the parts in the processing container 2, or an assembly error of parts at the time of the maintenance. In the present disclosure, however, it is also possible to estimate the cause of the abnormality by continuously monitoring the stability of the plasma. That is, for example, in a case where it is continuously determined as an abnormality after the maintenance, it is estimated that it is caused by an assembling error. In addition, in a case where it is continuously determined as an abnormality after a certain processing, it is suspected that there are, for example, damages to the parts. Further, when it is not determined as an abnormality in the subsequent processing after it is determined as an abnormality, the abnormality is accidental, and it may be estimated that the abnormality is caused, for example, when the reaction products in the processing container 2 are accidentally peeled off and scattered.

Furthermore, as described above, in the plasma processing, the light emission state of the plasma is generally monitored for the end point detection. In the plasma processing apparatus 1 of the present disclosure, since the stability of the plasma is determined based on information of the light emission intensity used for the end point detection, it is not necessary to add a new device.

In the exemplary embodiment described above, the plasma processing has been performed on, for example, the wafer W as a product. However, the present disclosure may of course be applied to, for example, a case where a plasma processing is performed on a dummy wafer for inspection. For example, the plasma processing is performed using a dummy wafer after maintenance or cleaning is performed, and after the stability of the plasma in the plasma processing is confirmed, the processing is then performed on a wafer W as a product, thereby avoiding lowering the yield. Further, from the viewpoint of determining the stability of the plasma based on the light emission intensity of the plasma, the wafer W or the dummy wafer is not always necessary. The emission intensity of the plasma may be monitored after the plasma is generated in the processing container 2 in a state where the wafer W or the dummy wafer is not carried into the processing container 2. When the stability of the plasma is determined in a state where the wafer W or the dummy wafer is not carried into the processing container 2, the definite integration is performed by the stability determination unit 73 over the entire period, for example, from the ignition of the plasma to the extinguishing of the plasma, but the time from the ignition of the plasma to the extinguishing may be appropriately set. Regardless of whether or not the wafer W or the dummy wafer is carried into the processing container 2, the plasma is unstable immediately after ignition of the plasma, as compared with a stationary state of the plasma. Thus, the period in which the definite integration is performed may be shortened by excluding, for example, the time immediately after the ignition of the plasma. The period to be shortened is appropriately determined based on, for example, the data for the light emission intensity.

In the above exemplary embodiment, the threshold value in the stability determining unit 73 is set in advance, but the threshold value may be appropriately changed by, for example, providing a setting screen for changing the threshold value in the output unit 74.

In the above exemplary embodiment, descriptions have been made on the case where the light emission intensity derived from, for example, the oxygen plasma is detected by the light emission detecting mechanism 26, but the wavelength of the light to be detected is not limited to the contents of the present exemplary embodiment. The light emission intensity may be detected for another wavelength, for example, a wavelength of 703.7 nm derived from fluorine plasma. The present inventors have confirmed that when the plasma becomes unstable, a similar tendency is obtained in any of the wavelengths of light detected in the processing container 2. Therefore, in the determination of the stability of the plasma, it is possible to use light of an arbitrary wavelength which is detectable from the plasma processing apparatus 1. However, since the absolute value of the light emission intensity differs for each wavelength, the threshold value may be set for each wavelength.

Further, it is also possible to detect the light emission intensities for a plurality of wavelengths of light in parallel, generate a first function and a second function for a plurality of light emission intensities to calculate respective integral values, and determine that there is no plasma stability when any one of the calculated integral values exceeds a threshold value.

In the above exemplary embodiment, plasma is generated by microwaves, but the means for generating plasma is not limited to the contents of the present exemplary embodiment. For example, the present disclosure may also be applied to plasma generated by other means such as, for example, parallel plate plasma or ICP plasma, in addition to the microwaves.

Although exemplary embodiments of the present disclosure have been described with reference to the accompanying drawings, the present disclosure is not limited thereto. It should be understood that various modifications or changes that can be easily conceived by those skilled in the art within the scope and spirit described in the claims fall within the scope of the present disclosure. Further, in the above exemplary embodiment, the present disclosure is applied to the plasma processing for performing the etching processing, but the present disclosure may also be applied to a plasma processing for performing a substrate processing other than the etching processing (e.g., a film formation processing or a sputtering). Further, the workpiece to be processed by the plasma processing of the present disclosure may be any substrate such as, for example, a glass substrate, an organic EL substrate, or a substrate for flat panel display (FPD).

INDUSTRIAL APPLICABILITY

The present disclosure is useful when a plasma processing is performed on a substrate such as, for example, a semiconductor wafer.

DESCRIPTION OF SYMBOLS

| | |
|---|---|
| 1: plasma processing apparatus | 2: processing container |
| 3: radial line slot antenna | 4: controller |
| 10: susceptor | 11: matcher |
| 12: high frequency power source | 13: heater |
| 14: focus ring | 20: exhaust chamber |
| 21: exhaust mechanism | 22: exhaust pipe |
| 23: adjustment valve | 24: baffle plate |
| 31: microwave transmitting plate | 32: slot plate |
| 33: slow-wave plate | 40: coaxial waveguide |
| 71: first function generating unit | 72: second function generating unit |
| 73: stability determining unit | W: wafer |

What is claimed is:

1. A method for determining stability of plasma in a plasma processing apparatus for performing a plasma processing by converting a processing gas supplied in a processing container into plasma, the method comprising:
    detecting a light emission intensity of the plasma in the processing container while the plasma is generated in the processing container;
    generating a first function representing a relationship between time and the light emission intensity from a detection result of the light emission intensity;
    differentiating the first function with time to calculate a set of differential values;
    generating a second function from a relationship between a set of absolute values of the differential values and time;
    integrating the second function with time to calculate an integral value; and
    determining stability of the plasma based on the calculated integral value.

2. The method of claim 1, wherein the stability of the plasma is determined by comparing the calculated integral value with a predetermined threshold value.

3. The method of claim 2, wherein the light emission intensity is detected for each of a plurality of wavelengths of light,
    the first function and the second function are generated for each of the plurality of wavelengths of light,
    the threshold value is set for each of the plurality of wavelengths of light, and
    if at least one of the integral values for the plurality of wavelengths of light exceeds the threshold value, it is determined that the plasma is unstable.

4. The method of claim 1, wherein a substrate is processed while the plasma is generated.

5. The method of claim 2, wherein a substrate is processed while the plasma is generated.

6. The method of claim 3, wherein a substrate is processed while the plasma is generated.

7. A plasma processing apparatus for performing a plasma processing by converting a processing gas supplied in a processing container into plasma, the apparatus comprising:
    a processing gas supply unit that supplies a processing gas into the processing container;

a plasma generating unit that generates plasma of the processing gas in the processing container;

a light emission detecting mechanism that detects a light emission intensity of the plasma generated in the processing container;

a first function generating unit that generates a first function representing a relationship between time and the light emission intensity from a detection result of the light emission intensity by the light emission detecting mechanism;

a second function generating unit that differentiates the first function with time to calculate a set of differential values, and generates a second function from a relationship between a set of absolute values of the differential values and time; and a stability determining unit that integrates the second function with time to calculate an integral value, and determines stability of the plasma based on the calculated integral value.

8. The plasma processing apparatus of claim 7, wherein the stability determining unit determines the stability of the plasma by comparing the calculated integral value with a predetermined threshold value.

9. The plasma processing apparatus of claim 8, wherein the light emission intensity detecting mechanism is provided for each of a plurality of wavelengths of light, the first function generating unit and the second function generating unit generate the first function and the second function for each of the plurality of wavelengths of light, respectively, and the stability determining unit determines that the plasma is unstable if at least one of the integral values for the plurality of wavelengths of light exceeds a threshold value that is set for each of the plurality of wavelengths of light.

10. The method of claim 7, wherein a substrate is processed while the plasma is generated.

11. The method of claim 8, wherein a substrate is processed while the plasma is generated.

12. The method of claim 9, wherein a substrate is processed while the plasma is generated.

* * * * *